Dec. 26, 1961 B. J. MILLER ETAL 3,014,995

TRANSISTOR HEARING AID

Filed March 18, 1959

INVENTORS
Bertrand J. Miller
George Wertwijn
BY Francis W. Crotty
ATTORNEY

United States Patent Office 3,014,995

Patented Dec. 26, 1961

3,014,995

TRANSISTOR HEARING AID

Bertrand J. Miller, Mount Prospect, and George Wertwijn, Park Ridge, Ill., assignors to Zenith Radio Corporation, a corporation of Delaware Filed Mar. 18, 1959, Ser. No. 800,175
4 Claims. (Cl. 179—107)

Figure 1:
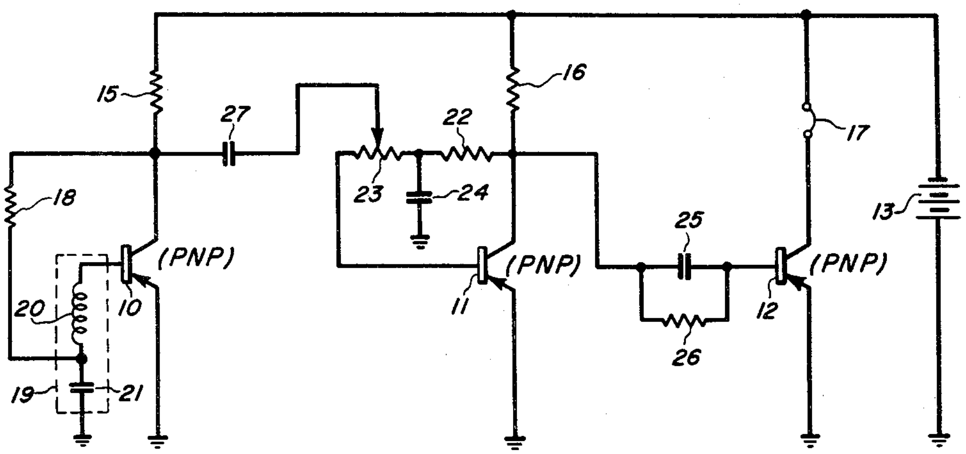

This invention is directed to a transistor hearing aid and concerns especially the construction of both the hearing-aid transistor and the circuitry through which such a transistor is employed in an improved hearing-aid device.

Transistor hearing aids represent distinct and important advances over their predecessor vacuum-tube aids because a transistor device is much smaller in overall physical size and greatly relieves the requirements of the power supply. Indeed, batteries of smaller physical size may be employed and the useful battery life in the device is greatly extended over that of the vacuum-tube instrument.

Transistor hearing aids, as such, are well known in the art and usually employ cascaded stages of audio amplification featuring grounded-emitter circuitry. The grounded-emitter circuit achieves most efficient use of the power supply capabilities, permitting maximum power gain from the device. Experience has shown it to be desirable that the aid be capable of an electrical power gain in the order of 83 db. and a power output of about 1 mw. undistorted; such an instrument provides an acoustic gain of approximately 65 db. Instruments are currently available with this power capability but they utilize four transistor stages of audio amplification. It would be highly desirable if the instrument were able to provide this measure of gain and power output while requiring a lesser number of stages of audio amplification and that objective is attainable with the subject invention.

Moreover, audio-frequency transistors presently available commercially have an undesirably wide gain spread, that is to say, the collector-to-base current amplification factor varies widely between transistors. The amplification factor may vary, for example, from 50 to 280 and this variation generally requires that the complement of transistors to be utilized in making a given hearing-aid instrument be carefully selected or matched so that the instrument exhibits the proper power gain and, as stated above, this usually requires four stages of amplification. Of course, it is recognized that at least theoretically one might select a group of three transistors individually having a gain of approximately 150 and with them construct an instrument of the required gain capabilities utilizing only three stages of amplification. Were this technique to be adopted as a commercial expedient, two highly undesirable results would ensue. In the first place, the hearing-aid microphone would have to be a higher impedance device than that conventionally employed. This would not appear, at first blush, to represent any particular obstacle but the difficulty it introduces is manifest when it is remembered that the microphone as now constructed uses the thinnest wire that modern commercial fabricating techniques are able to cope with as a practical matter. A higher impedance microphone would necessitate the use of even finer wire with attendant difficulties of fabrication.

The second unhappy result would be a severe reduction in yield of the transistors themselves because the stated premise contemplates that transistors which have a significantly different amplification factor would be rejected. Again, this would contribute to an undesirable increase in the cost of the hearing-aid instrument.

Accordingly, it is an object of the present invention to provide a transistor hearing aid, having improved transistor devices and improved circuitry for utilizing such devices in a multi-stage audio amplifier.

It is a specific object of the invention to provide an improved transistor hearing aid, utilizing transistor devices having markedly different characteristics than do currently available transistors to the end that an aid of a given power capability may be achieved through the use of a lesser number of stages of amplification.

It is a specific object of the invention to provide a transistor hearing aid employing transistor devices of improved construction.

It is another particular object of the invention to provide an improved transistor construction for use in a transistor type hearing aid characterized by the fact that the transistor is more accurately reproducible with the result that the gain spread is materially reduced.

The invention finds unique application to a transistor hearing aid comprising a plurality of transistors individually having a base, collector and emitter electrodes and further having a base resistivity $\rho_b$ in the range of 0.3 to 0.8 ohm-centimeter. Means are provided for connecting the emitter electrode of each of the transistors to a plane of reference potential in respect of unidirectional and signal potentials. A source of unidirectional potential is provided having a value not exceeding three volts and has one terminal connected to the plane of reference potential. Resistive impedance means connect the base and collector electrodes of the transistors to another terminal of the potential source to establish an operating bias for each of the transistors. A series of coupling capacitors individually connected between the collector electrode of one and the base electrode of another transistor completes therewith a plurality of cascaded stages of audio amplification. A microphone is connected between the base and emitter electrodes of the first of the stages of amplification and a sound reproducer is connected between the collector and the emitter electrodes of the last of the stages of amplification.

Figure 2:
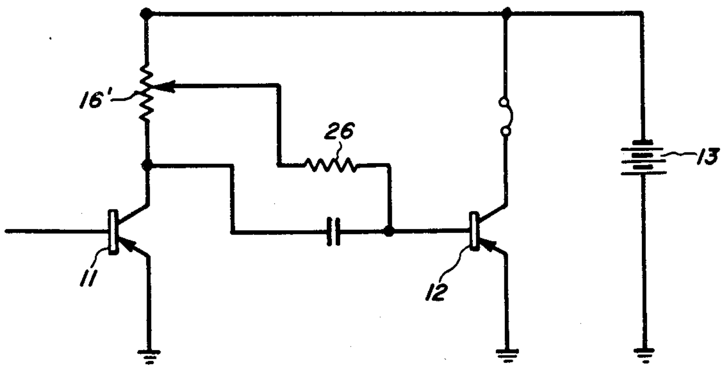

The features of the invention which are believed to be novel are set forth with particularity in the appended claims. The organization and manner of operation of the invention, together with further objects and advantages thereof, may best be understood by reference to the following description taken in connection with the accompanying drawing in the several figures of which like reference numerals identify like elements, and in which:

FIGURE 1 is a schematic circuit diagram of a three-stage transistor hearing aid constructed in accordance with the invention; and FIGURE 2 shows a modification of the coupling between the penultimate and final stages of such a hearing aid.

Referring now more particularly to FIGURE 1, the transistor hearing aid there represented is similar to those of the prior art in that it includes a plurality of cascaded stages of audio amplification, each of which has a grounded-emitter transistor energized by a source of unidirectional potential not exceeding 3 volts. The transistors are designated 10, 11 and 12 and are shown as of the PNP type although they may be NPN devices if desired. When constructed in accordance with the teachings of the invention and biased in a manner to be considered hereinafter, they are substantially identical as to gain which relaxes the previous practice of grading transistors by their characteristics to facilitate matching the units to get a set or complement suitable for use in one hearing aid. This unique and salient objective is realized by an unusual but advantageous construction of the transistor.

The transistor is constructed of a semi-conductive material such as germanium, doped in accordance with any of the many well-known techniques to exhibit a base resistivity $\rho_b$ in a range of 0.3 to 0.8 ohm-centimeter. An especially useful resistivity of the base material is 0.65 ohm-centimeter plus or minus 10%. In addition to this unusual value of resistivity of the base material, the transistor is constructed to exhibit a base resistance $r_{bb'}$, not exceeding 200 ohms; the smaller the value of this parameter, the better for the transistor under consideration. The base resistance is a function of the resistivity of the base material and the geometry of the transistor, especially the thickness of the base which is usually much smaller than the transverse dimensions and the base-emitter spacing. Since the device has a very low base resistivity, the spacing of the base and emitter makes it practicable to realize a base resistance which is less than 150 ohms and on the average is 50 ohms. The short-circuited collector-to-base current amplification factor or gain $\alpha_{cb}$ of the transistor is centered about 75 or even 50 as distinguished from commercially available audio transistors which center about 150.

A transistor satisfying these specifications is characterized by the fact that the injection efficiency has the dominant effect in determining the amplification factor $\alpha_{cb}$ while the influence of the recombination factors is but a second order effect. More particularly, the amplification factor $\alpha_{cb}$ at low current densities of approximately 1 milliampere and with an emitter diameter of about 0.020" is related to the injection properties of the emitter and the recombination properties of the germanium surface of the transistor in the following way:

$$\frac{1}{\alpha_{cb}}=\frac{\frac{1}{\rho_b}W}{\frac{1}{\rho_e}L_e}+C_1\frac{W^2}{\tau}+C_2SW^2 \qquad (1)$$

where $C_1$ and $C_2$ are constants subject to change if the currents and voltages of the bias condition are changed, $\rho_b$ is the resistivity of the base material, $\rho_e$ is the resistivity of the emitter region, $L_e$ is the diffusion length for electrons in the emitter region, W is the base thickness or distance between emitter and collector electrodes, $\tau$ is the minority carrier lifetime in the base region, and S is the surface recombination velocity. The first term of the equation may be referred to as the injection term and is related to injection efficiency as follows:

$$\frac{1}{1+\frac{\frac{1}{\rho_b}W}{\frac{1}{\rho_e}L_e}} \qquad (2)$$

which is approximately equal to:

$$1-\frac{\frac{1}{\rho_b}W}{\frac{1}{\rho_e}L_e} \qquad (3)$$

The remaining two terms of Equation 1 pertain to recombination. The term involving $\tau$ is referred to as the bulk recombination term and that including S is referred to as the surface recombination term. The constants $C_1$ and $C_2$ take into consideration such things as the physical dimensions and arrangement of the transistor structure. They of course are constant in any case where one examines the properties of the device assuming the emitter to be constructed of a known material, the dimensions of the device to be fixed, and the bias voltages and currents to be approximately constant.

Where the base resistivity $\rho_b$ is in the range specified, it becomes feasible to so control the characteristics of the transistor that the amplification factor $\alpha_{cb}$ is determined most predominantly by the injection term of Equation 1, relegating the recombination terms of the equation to only second order effects. This is in marked contrast with prior audio transistor devices wherein, among others, the base resistivity is several times higher and wherein the injection term is much smaller than the recombination term of Equation 1.

Preferably, the transistor has an emitter constructed of indium whereas it is common practice today to construct the emitter of an alloy of indium and gallium. The material of the emitter bears significantly on the value of $$\frac{1}{\rho_e}L_e$$

being larger by a factor of about 3 for indium-gallium alloys than for pure indium. Accordingly, if it be desired to construct the emitter of this alloy, the thickness W of the transistor is changed, specifically it is decreased, to preserve the dominance of the injection term in the expression for amplification factor $\alpha_{cb}$.

A transistor having the described specifications exhibits a minimized gain spread or, expressed in other words, has the desirable attribute of reproducibility. That is to say, transistors made in accordance with these teachings have a far greater identity, one with respect to the other, than is true of the conventional audio transistor. Such a transistor is further distinguished from the conventional audio transistor in that its breakdown voltage is of the order of 10 to 20 volts and its preferred operating voltage is less than 6 volts. Most transistor hearing aids are powered from a 1½ volt source but some are driven from a 3 volt unidirectional potential source or battery. The described transistor is uniquely adaptable to either case because the maximum voltage instantaneously applied to its electrodes does not exceed 6 volts.

Returning now to further consideration of the schematic circuit diagram of FIGURE 1, the transistors are energized by a battery 13 usually representing 1.2 to 1.5 volts but in any event, not exceeding 3 volts. The collector electrodes of transistors 10 and 11 connect to the negative terminal of the battery through resistors 15 and 16 while the collector of the transistor in the final stage connects to the same terminal through a sound reproducer schematically shown as a headset 17. The bias provisions of the first stage further include a resistor 18 which may be connected to the base electrode of the transistor through the coil of the microphone enclosed within broken-line rectangle 19 and represented as comprising an inductor 20 and a capacitor 21 series connected between the base electrode and ground. In the second or penultimate stage, the bias network is extended to the base by means of a pair of series-connected resistors 22 and 23; the latter may take the form of a potential divider, as indicated, to serve as a volume control. The junction of resistors 22 and 23 is bypassed to ground for signal frequencies by means of a condenser 24. The final interstage coupling includes a condenser 25 connected between the collector of transistor 11 and the base of transistor 12. A resistor 26 is connected in shunt with this condenser and represents a further departure in this hearing-aid instrument from practices of the prior art. This circuit connection contributes to the improved performance of the aid as will be explained presently. The coupling from the first to the second stage is through a condenser 27 to the variable tap of volume control 23.

The hearing-aid instrument will be recognized as a three-stage grounded-emitter transistor audio amplifier to which received audio signals are applied by way of microphone 19. These signals, after successive amplification in stages 10, 11 and 12, are reproduced in reproducer 17 in the usual way.

It has been found that the transistor itself is a nonlinear device and a rectifying action is experienced which has a tendency to drive the device in the direction of cut off; this is especially true of the last stage because it usually has the greatest signal level. If the base resistance is the dominant term in the following expression for input impedance:

$$Z=r_{bb'}+\alpha_{cb}\frac{C_5}{I_e} \qquad (4)$$

where $I_e$ is the emitter current and $C_5$ is a constant, the rectification may be reduced but at some sacrifice of gain. However, the final interstage coupling of the arrangement of FIGURE 1 improves the operation with respect to input circuit rectification without impairing the gain. The shunting resistor 26, used in place of a larger resistor customarily connected from the base to the negative terminal of battery 13, reduces the D.C. impedance of the bias source for the last stage. Consequently, if there is a tendency to develop a bias because of input circuit rectification the amount of the bias is less because of the reduction in input impedance. A further advantage of the described final interstage coupling is apparent from consideration of the circuit performance in the face of gross overload. For this condition, the collector electrode of the penultimate stage tends to vary between zero and full battery voltage with the result that the collector potential increases, pulling the potential of the base electrode of transistor 12 with it. This potential change is in a direction to compensate the bias that would otherwise be developed through the rectifying properties of the final stage. A further distinct advantage of the final interstage coupling is the quick recovery from a paralysis effect that could otherwise be realized in the presence of gross overload. The described circuit permits faster recovery time because the lower input impedance of transistor 12 provides a shorter discharge time constant for condenser 25.

The specific connection of resistor 26 of FIGURE 1 imposes the requirement that it be chosen with relation to the operating point of both transistors 11 and 12. In particular, the collector voltage of transistor 11 is governed by its operating point and the value of that voltage in conjunction with the value of resistor 26 determines the current condition or operating point of transistor 12. If the resistor is connected between the base electrode of the last stage and a tap on a voltage divider 16' through which the collector of the penultimate stage connects to the bias source, as shown in FIGURE 2, the requirements imposed on resistor 26 are relaxed. In this alternative connection, the voltage at the tap of potentiometer 16' is less dependent on the operating point of transistor 11 than is the collector voltage thereof and resistor 26 need now be selected primarily only with regard to the operating point of transistor 12 in the final stage.

The resistance coupling, especially as described for the final stage, is particularly applicable for instruments having a power output of about 1 mw. but is no necessary limitation on the subject invention. Instruments have been proposed for individuals suffering from modest to severe hearing loss providing a power output of some 25 mw. As presently constructed, they employ a push-pull output stage that is transformer coupled to the penultimate stage and require five transistors. This can be reduced to four transistors, omitting one stage of amplification, by utilizing the transistor construction of this invention.

The described hearing aid has been constructed employing transistors satisfying the objectives recited above and has been operated satisfactorily. With them, the obligation of matching transistor components to arrive at a complement suited to serve as the amplifier of a hearing-aid instrument is relaxed. Of equal importance is the fact that the necessary electrical power gain, acoustical gain and power output are achieved through the use of three stages of amplification which is one less stage than the number required heretofore in instruments of conventional design. It is also expected that a two-stage instrument employing the transistor device and interstage coupling described herein will provide the same gain potential in eyeglass hearing aids that is now achieved with three-stage instruments. It has further been found that the described transistor is less critical with respect to surface conditions than is the case with transistors having the usual, and by comparison very high, value of base resistivity. Further, since the recombination terms of Equation 1 have only a second order effect in determining the amplification factor $\alpha_{cb}$, the gain factor is relieved of tendencies to change with aging or other conditions that otherwise cause the surface recombination factor to vary with time.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

We claim:

1. A transistor hearing aid comprising: a plurality of transistors individually having base, collector and emitter electrodes and further having a base resistivity $\rho_b$ in the range of 0.3 to 0.8 ohm-centimeter; means for connecting the emitter electrode of each of said transistors to a plane of reference potential in respect of unidirectional and signal potentials; a source of unidirectional potential having a value not exceeding three volts and having one terminal connected to said plane of reference potential; resistive impedance means for connecting the base and collector electrodes of said transistors to another terminal of said potential source to establish an operating bias for each of said transistors; a series of coupling capacitors individually connected between the collector electrode of one and the base electrode of another of said transistors to complete therewith a plurality of cascaded stages of audio amplification; a microphone connected between the base and emitter electrodes of the first of said stages of amplification; and a sound reproducer connected between the collector and emitter electrodes of the last of said stages of amplification.

2. A transistor hearing aid comprising: a plurality of transistors individually having base, collector and emitter electrodes and further having a base resistivity $\rho_b$ in the range of 0.3 to 0.8 ohm-centimeter, a base resistance $\rho_{bb'}$ less than 200 ohms, and a collector-to-base current amplification factor in the range of 50 to 100; means for connecting the emitter electrode of each of said transistors to a plane of reference potential in respect of unidirectional and signal potentials; a source of unidirectional potential having a value not exceeding three volts and having one terminal connected to said plane of reference potential; resistive impedance means for connecting the base and collector electrodes of said transistors to another terminal of said potential source to establish an operating bias for each of said transistors; a series of coupling capacitors individually connected between the collector electrode of one and the base electrode of another of said transistors to complete therewith a plurality of cascaded stages of audio amplification; a microphone connected between the base and emitter electrodes of the first of said stages of amplification; and a sound reproducer connected between the collector and emitter electrodes of the last of said stages of amplification.

3. A transistor hearing aid comprising: a plurality of transistors individually having base, collector and emitter electrodes and further having a base resistivity $\rho_b$ in the range of 0.3 to 0.8 ohm-centimeter, a base resistance $\rho_{bb'}$ less than 200 ohms, and a collector-to-base current amplification factor in the range of 50 to 100; means for connecting the emitter electrode of each of said transistors to a plane of reference potential in respect of unidirectional and signal potentials; a source of unidirectional potential having a value not exceeding three volts and having one terminal connected to said plane of reference potential; resistive impedance means for connecting the base and collector electrodes of said transistors to another terminal of said potential source to establish an operating bias for each of said transistors; a series of coupling capacitors individually connected between the collector electrode of one and the base electrode of another of said transistors to complete therewith a plurality of cascaded stages of audio amplification; a resistor connected in shunt relation to the one of said capacitors which couples the penultimate and final stages of amplification; a microphone connected between the base and emitter electrodes of the first of said stages of amplification; and a sound reproducer connected between the collector and emitter electrodes of the last of said stages of amplification.

4. A transistor hearing aid comprising: a plurality of transistors individually having base, collector and emitter electrodes and further having a base resistivity $\rho_b$ in the range of 0.3 to 0.8 ohm-centimeter, a base resistance $\rho_{bb'}$ less than 200 ohms, and a collector-to-base current amplification factor in the range of 50 to 100; means for connecting the emitter electrode of each of said transistors to a plane of reference potential in respect of unidirectional and signal potentials; a source of unidirectional potential having a value not exceeding three volts and having one terminal connected to said plane of reference potential; resistive impedance means for connecting the base and collector electrodes of said transistors to another terminal of said potential source to establish an operating bias for each of said transistors; a series of coupling capacitors individually connected between the collector electrode of one and the base electrode of another of said transistors to complete therewith a plurality of cascaded stages of audio amplification; a resistor connected from the base electrode of the final stage of amplification to a tap on the aforesaid resistive impedance connected to the collector electrode of the penultimate stage; a microphone connected between the base and emitter electrodes of the first of said stages of amplification; and a sound reproducer connected between the collector and emitter electrodes of the last of said stages of amplification.

References Cited in the file of this patent

UNITED STATES PATENTS

| | | |
|---|---|---|
| 2,613,282 | Scaife | Oct. 7, 1952 |
| 2,801,296 | Blecher | July 30, 1957 |
| 2,822,430 | Lin | Feb. 4, 1958 |
| 2,901,556 | Chapman | Aug. 25, 1959 |

FOREIGN PATENTS

| | | |
|---|---|---|
| 201,972 | Australia | May 31, 1956 |

OTHER REFERENCES

Angell et al.: "Microalloy Transistor for Very High Switching Speeds," paper presented at Wescon on August 23, 1956, pages 1–15.